United States Patent
Fine et al.

(10) Patent No.: US 7,203,882 B2
(45) Date of Patent: Apr. 10, 2007

(54) CLUSTERING-BASED APPROACH FOR COVERAGE-DIRECTED TEST GENERATION

(75) Inventors: Shai Fine, Ra'anana (IL); Avi Ziv, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 10/930,327

(22) Filed: Aug. 31, 2004

(65) Prior Publication Data

US 2006/0048026 A1   Mar. 2, 2006

(51) Int. Cl.
*G01R 31/28* (2006.01)

(52) U.S. Cl. ...................... 714/741; 714/724
(58) Field of Classification Search .......... 714/741, 714/742, 738, 724; 716/5
See application file for complete search history.

(56) References Cited

U.S. PATENT DOCUMENTS 6,141,630 A * 10/2000 McNamara et al. .......... 703/14
6,941,303 B2 * 9/2005 Perrizo ........................ 707/6

* cited by examiner

*Primary Examiner*—James C Kerveros
(74) *Attorney, Agent, or Firm*—Stephen C. Kaufman

(57) ABSTRACT

A coverage-directed test generation technique for functional design verification relies on events that are clustered according to similarities in the way that the events are stimulated in a simulation environment, not necessarily related to the semantics of the events. The set of directives generated by a coverage-directed test generation engine for each event is analyzed and evaluated for similarities with sets of directives for other events. Identified similarities in the sets of directives provide the basis for defining event clusters. Once clusters have been defined, a common set of directives for the coverage-directed test generation engine is generated that attempts to cover all events in a given cluster.

23 Claims, 6 Drawing Sheets

CLUSTERING-BASED APPROACH FOR COVERAGE-DIRECTED TEST GENERATION

BACKGROUND OF THE INVENTION

1. Field of the Invention

This invention relates to functional design verification. More particularly, this invention relates to improvements in coverage-directed test generation techniques for functional design verification.

2. Description of the Related Art

Functional verification is widely acknowledged to be a bottleneck in the hardware design cycle. Indeed, up to 70% of design development time and resources are typically spent on functional verification. Allowing users to find design flaws, and fixing them in a subsequent release would be unwise and costly for three main reasons: (1) harm to reputation and brand-name; (2) a high cost of recall and replacement when there is a large installed base; and (3) litigation, should design flaws cause injury.

In current industrial practice, dynamic verification is the main functional verification technique for large and complex designs. Dynamic verification is accomplished by generating a large number of tests using random test generators, simulating the tests on the design-under-test, and checking that the design-under-test behaves according to its specification.

The rationale behind verification by simulation is that one acquires confidence in the correctness of a design-under-test by running a set of test cases that encompass a sufficiently large number of different cases, which in some sense is assumed to be a representative sample of the full space of possible cases. The ability of the design-under-test to correctly handle all cases is inferred from the correct handling of the cases actually tested. This approach is discussed, for example, in the document *User Defined Coverage—A Tool Supported Methodology for Design Verification*, Raanan Grinwald, Eran Harel, Michael Orgad, Shmuel Ur, and Avi Ziv, Proc. $38^{th}$ Design Automation Conference (DAC38), pages 158–163, 1998. When conducting simulations, it is desirable to define a particular subspace, which is considered to be "interesting" in terms of verification, and then to generate tests selected at random that cover the subspace.

Test cases developed by algorithms such as the foregoing are typically implemented on a test generator, which may optionally bias the tests based on internal testing knowledge. Such test generators are described in the following documents: *Model-Based Test Generation For Processor Design Verification*, Y. Lichtenstein, Y. Malka and A. Aharon, Innovative Applications of Artificial Intelligence (IAAI), AAAI Press, 1994; *Constraint Satisfaction for Test Program Generation*, L. Fournier, D. Lewin, M. Levinger, E. Roytman and Gil Shurek, Int. Phoenix Conference on Computers and Communications, March 1995; and *Test Program Generation for Functional Verification of PowerPC Processors in IBM*, A. Aharon, D. Goodman, M. Levinger, Y. Lichtenstein, Y. Malka, C. Metzger, M. Molcho and G. Shurek, $32^{nd}$ Design Automation Conference, San Francisco, June 1995, pp. 279–285.

The term coverage concerns checking and showing that testing has been thorough. Coverage is any metric of completeness with respect to a test selection criterion for the design-under-test. The definition of coverage events is usually specific to a design-under-test, and constitutes a major part in the definition of the verification plan of the design. As used herein the terms "event" or "coverage event" refer to a transfer of data or control signals in the design-under-test to perform some operation. The term coverage event also includes generalizations relating to the design, e.g., statement coverage, e.g., "Statement 123 in the source code was executed", and measures, e.g., "The handling of a transaction finished in less than 2 seconds". Often, a family of coverage events that share common properties are grouped together to form a coverage model. Members of the coverage model are called coverage tasks and are considered part of the test plan. A task thus constitutes one or more events. Simply stated, the idea is to create in some systematic fashion a large and comprehensive list of tasks or events, and check that in the testing phase each task or event was executed. A common coverage metric used in the industry is statement coverage, which is a metric of the number of source language statements executed under test. Coverage measurement tools for user-defined coverage models are disclosed in U.S. Pat. No. 6,356,858 to Malka et al., of common assignee herewith, and herein incorporated by reference.

The analysis of coverage reports, and their translation to a set of test generator directives to guide and enhance the implementation of a test plan, result in major manual bottlenecks in an otherwise highly automated verification process. Coverage directed test generation (CDG) is a technique to automate the feedback from coverage analysis to test generation. Goals of coverage-directed test generation include to improving the coverage progress rate, reaching non-covered events, controlling and biasing the coverage distribution, and providing many different ways to reach a given coverage event. Achieving these goals should increase the efficiency and quality of the verification process and reduce the time and effort needed to implement a test plan.

A coverage-directed test generation technique using Bayesian networks is disclosed by the inventors hereof in the document, *Coverage-directed Test Generation for Functional Verification Using Bayesian Networks*, S. Fine and A. Ziv, in Proceedings of the 40th Design Automation Conference, pages 286–291, June 2003, which is herein incorporated by reference. A Bayesian network is a directed graph, whose nodes are random variables, and whose edges represent direct dependency between their sink and source nodes. Each node in the Bayesian network is associated with a set of parameters specifying its conditional probability given the state of its parents. The random nature of automatic test case generators imposes a considerable amount of uncertainty in the relationship between test directives and coverage tasks, e.g., the same set of directives can be used to generate many different test cases, each leading to different coverage tasks. This inherent uncertainty suggests casting the coverage-directed test generation process in a statistical inference framework. To this end, Bayesian networks offer an efficient modeling scheme by providing a compact representation of the complex, possibly stochastic relationships among the coverage-directed test generation ingredients, together with the possibility of encoding essential domain knowledge. The coverage-directed test generation process is performed in two main steps. In the first step, a training set is used to learn the parameters of a Bayesian network that models the relationship between the coverage information and the test directives. In the second step, the Bayesian network is used to provide the most probable directives that would lead to a given coverage task or set of tasks.

In general, a feedback-based, coverage-directed test generation engine can, be used to complete the coverage of a given coverage model in the following way: At each iteration the current coverage state is inspected, and then the engine is used to produce the appropriate, possibly multiple, sets of directives, designed to cover the remaining non-covered events. This process continues until the entire coverage model has been covered.

The above process automates the covering process and removes the manual bottleneck. However, the process is not very efficient, because at each iteration of the loop, the coverage-directed test generation engine generates a set of directives for each non-covered event. There are several ways in which a coverage-directed test generation engine can be used not only to achieve full coverage, but also to improve the coverage rate and increase the coverage efficiency. One possible approach to increase coverage efficiency is through careful selection of the order of events to be covered. The possible gain is due to the observation that a simulation run most often covers many other events in addition to the one it was designed to cover. Therefore, it is more efficient not to generate directives to events that are easy to cover, and instead let them be covered while trying to cover other, more difficult, events.

Another approach is cluster together a set of similar non-covered-events and generate a single set of directives that attempts to cover all these events. The semantics of the events provide a commonly used basis for clustering non-covered events. For example, hole analysis is a presentation method for coverage data, which can detect large non-covered subspaces (holes in the coverage) and improve the quality of verification. This technique is disclosed in the document, *Hole Analysis for Functional Coverage Data*, O. Lachish, E. Marcus, S. Ur, and A. Ziv, in Proceedings of the 39th Design Automation Conference, 2002, which is herein incorporated by reference. The hole analysis algorithm tries to find large non-covered subspaces in the coverage space, because such subspaces usually have similar semantics. The problem with this method is that in many cases the fact that non-covered events have similar semantics does not mean that the directives needed to cover the events are similar.

ADDITIONAL REFERENCES

[1]. J. Bergeron. Writing Testbenches: Functional Verification of HDL Models. Kluwer Academic Publishers, January 2000.

[2]. R. O. Duda and P. E. Hart. Pattern Classification and scene analysis. Wiley, 1973.

[3]. L. Fournier, Y. Arbetman, and M. Levinger. Functional verification methodology for microprocessors using the Genesys test-program generator. In Proceedings of the 1999 Design, Automation and Test in Europe Conference, 1999.

[4]. A. Hajjar, T. Chen, I. Munn, A. Andrews, and M. Bjorkman. High quality behavioral verification using statistical stopping criteria. In Proceedings of the 2001 Design, Automation and Test in Europe Conference, pages 411–418, March 2001.

[5]. T. Hastie, R. Tibshirani, and J. Friedman. The Elements of Statistical Learning. Springer-Verlag, 2001.

[6]. A. K. Jain, M. N. Murty, and P. J. Flynn. Data clustering: a review. ACM Computing Surveys, 31(3):264–323, 1999.

[7]. J. Pearl. Probabilistic Reasoning in Intelligent Systems: Network of Plausible Inference. Morgan Kaufmann, 1988.

[8]. F. C. Pereira, N. Tishby, and L. Lee. Distributional clustering of English words. In Proceedings of the 31st meeting of the Association for Computational Linguistics, pages 183–190, 1993.

SUMMARY OF THE INVENTION

According to a disclosed embodiment of the invention, a coverage-directed test generation technique for functional design verification relies on events that are clustered according to similarities in the way that the events are stimulated in a simulation environment, not necessarily related to the semantics of the events. As noted above, test generation is guided by directives that are intended to result in a test program that, when executed on the design-under-test, causes a specified event to occur. If this actually happens, the test program is then said to have covered the specified event.

More specifically, according to the invention, the set of directives relating to an event is analyzed and evaluated for similarities with sets of directives for other events. Identified similarities in the sets of directives provide the basis for defining event clusters. Once clusters have been defined, a common set of directives to guide the coverage-directed test generation engine is generated that attempts to cover all events in a given cluster. This technique differs from other known clustering techniques for coverage analysis, such as the above-noted hole analysis technique, in which clustering is based on similarity in the coverage space or in event semantics. Use of the common set of directives results in covering many previously non-covered events in a single simulation run.

The common set of directives for a given cluster generally has a lower accuracy, (that is, a lower probability of covering any particular event in a cluster) than the directives designed specifically for the event. However, using the common set of directives in simulation is more efficient than using specifically designed directives, in that the common set is more likely to cover many previously non-covered events in a single simulation run.

The invention provides a method for verifying a design, which is carried out by executing test programs on the design that are generated responsively to directives. Execution of the test programs causes occurrences of events. The method is further carried out by analyzing the occurrences in order to determine coverage of a coverage space of the design by the test programs. Responsively to the analysis, a set of non-covered events is defined and clustered according to similarities in respective ones of the directives with which the non-covered events are associated. A new directive is then associated with the non-covered events in the cluster, and new test programs generated responsively to the new directive for re-execution on the design.

In one aspect of the invention, the method is iterated until a predetermined end point is attained.

In another aspect of the method, execution of the test programs is performed by simulating the design.

In a further aspect of the method, execution of the test programs is performed on a hardware implementation of the design.

In yet another aspect of the method, the steps of executing, analyzing, defining a set of non-covered events, defining a cluster, associating a new directive, and generating a new test program are performed automatically.

In still another aspect of the method, associating a new directive with the non-covered events in the cluster is accomplished by selecting the new directive from among the directives of the cluster.

In an additional aspect of the method, associating a new directive with the non-covered events in the cluster comprises creating a new set of directives for covering all the events of the cluster.

In another aspect of the method, the step of clustering event is performed by K-medoid clustering.

The invention provides a computer software product, including a computer-readable medium in which computer program instructions are stored, which instructions, when read by a computer, cause the computer to perform a method for verifying a design, which is carried out by executing test programs on the design that are generated responsively to directives. Execution of the test programs causes occurrences of events. The method is further carried out by analyzing the occurrences in order to determine coverage of a coverage space of the design by the test programs. Responsively to the analysis, a set of non-covered events is defined and clustered according to similarities in respective ones of the directives with which the non-covered events are associated. A new directive is then associated with the non-covered events in the cluster, and new test programs generated responsively to the new directive for re-execution on the design.

The invention provides a verification system including a processor operative to perform a method for verifying a design, which is carried out by executing test programs on the design that are generated responsively to directives. Execution of the test programs causes occurrences of events. The method is further carried out by analyzing the occurrences in order to determine coverage of a coverage space of the design by the test programs. Responsively to the analysis, a set of non-covered events is defined and clustered according to similarities in respective ones of the directives with which the non-covered events are associated. A new directive is then associated with the non-covered events in the cluster, and new test programs generated responsively to the new directive for re-execution on the design.

BRIEF DESCRIPTION OF THE DRAWINGS

For a better understanding of the present invention, reference is made to the detailed description of the invention, by way of example, which is to be read in conjunction with the following drawings, wherein like elements are given like reference numerals, and wherein.

DETAILED DESCRIPTION OF THE INVENTION

In the following description, numerous specific details are set forth in order to provide a thorough understanding of the present invention. It will be apparent to one skilled in the art, however, that the present invention may be practiced without these specific details. In other instances well-known circuits, control logic, and the details of computer program instructions for conventional algorithms and processes have not been shown in detail in order not to unnecessarily obscure the present invention.

Software programming code, which embodies aspects of the present invention, is typically maintained in permanent storage, such as a computer readable medium. In a client-server environment, such software programming code may be stored on a client or a server. The software programming code may be embodied on any of a variety of known media for use with a data processing system. This includes, but is not limited to, magnetic and optical storage devices such as disk drives, magnetic tape, compact discs (CD's), digital video discs (DVD's), and computer instruction signals embodied in a transmission medium with or without a carrier wave upon which the signals are modulated. For example, the transmission medium may include a communications network, such as the Internet. In addition, while the invention may be embodied in computer software, the functions necessary to implement the invention may alternatively be embodied in part or in whole using hardware components such as application-specific integrated circuits or other hardware, or some combination of hardware components and software.

Overview.

Figure 1:
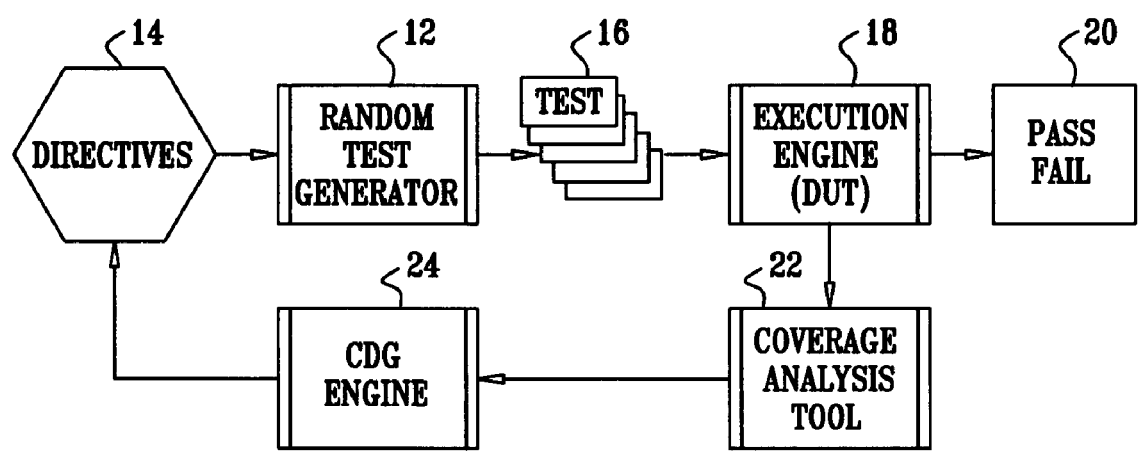
FIG. 1 is a block diagram illustrating a coverage-directed test generation system, which is constructed and operative in accordance with a disclosed embodiment of the invention.

Turning now to the drawings, reference is initially made to FIG. 1, which is a block diagram illustrating a coverage-directed test generation verification system 10 that is constructed and operative in accordance with a disclosed embodiment of the invention. The system 10 enables the creation of test programs that have various degrees of randomness. The ability of the system 10 to introduce random unspecified values is fundamental, since design flaws in practice are usually unpredictable. However, the system 10 typically contains provisions for biasing the test programs toward conditions of interest, for example boundary conditions, or specific byte alignments. The system 10 can be implemented using software executing on a processor, such as a general purpose computer or work-station, and once configured, is capable of automatic operation, without substantial human involvement.

A generic test generator engine 12 is influenced by input directives 14. The influence of the directives 14 includes, for example, the identity of the test instructions generated, their parameters, relative order, and various events relating to the instructions. The test generator engine 12 produces a suite of test programs 16, which are then executed on an execution engine 18. The execution engine 18 is typically a simulator of a design-under-test (DUT). However, the invention can be practiced in embodiments of the system 10 in which the execution engine 18 is realized as a hardware implementation of the design-under-test.

Following execution of the test programs 16, a test report 20 is issued, indicating the results of the tests.

A coverage analyzer 22 evaluates the coverage provided by the runs of the test-programs 16. The coverage analyzer 22 can be the coverage measurement tool for user-defined coverage models, which is disclosed in the above-noted U.S. Pat. No. 6,356,858.

The results of the coverage analysis performed by the coverage analyzer 22 are provided as feedback to a CDG engine 24, which then automatically modifies the directives 14 so as to modify the behavior of the test generator engine 12 The modifications are intended to improve the coverage provided by the test programs 16 in, a subsequent test run or simulation and to reach the goals of the test plan.

Increasing Coverage Efficiency via Clustering Techniques.

Continuing to refer to FIG. 1, the CDG engine 24 has been adapted in accordance with the principles of the invention. Generally, at each iteration the current coverage state is inspected, and then the engine is used to produce the appropriate, possibly multiple, sets of directives, designed to cover remaining non-covered events of a coverage model. This process continues until an end point is reached. Typically, the end point is coverage of the entire coverage model. Alternatively, the end point may be completion of a predetermined number of iterations.

A common practice, while using simulation based verification techniques, is to focus attention on the progress of coverage as a function of time or the number of simulation runs. This information is often used to assess the quality of the verification process and estimate the resources needed to complete the coverage of the model. Therefore, "coverage rate" and "coverage completion", i.e., the slope and the length of the progress graph, respectively, are good measures of coverage efficiency. These metrics are referred to collectively herein as measures of coverage efficiency.

When the principles of the invention are applied, the CDG engine 24 can be used not only to achieve full coverage, but also to improve the coverage rate and the coverage completion. One approach to increasing coverage efficiency is through careful selection of the order of events to be covered. The possible gain is due to the observation that a simulation run most often covers many other events in addition to the one it was designed to cover. A strategy is therefore recommended, in which the design of directives to stimulate easier-to-reach events is postponed, hoping that such events will be covered incidentally in earlier iterations of the verification process, in which case such directives can be omitted.

Of course, in constructing the directives 14 for the test generator engine 12, it is desirable to exploit available a-priori knowledge, e.g., ordering events based on their difficulty of coverage, and exploiting available semantic (domain) knowledge e.g., partitioning the coverage space into sub-regions of events that share some semantic proximity, such as error events. However, when applying the teachings of the instant invention, even better results can be achieved, as compared with targeting directives at individual events. In preparing clusters, the proximity of events is not determined solely by their semantics, but also by the way the simulation environment stimulates them. At the level of abstraction at which the CDG procedure is functioning in the system 10, proximity among events is indicated by the similarity of the designed directives.

In exemplary simulation environments, the directives 14 may be sets of numeric values selected from prescribed ranges, which constitute parameters of the tests that are generated by the test generator engine 12. For example, the values could be weights that bias the random test generator, or which enable or disable flags. It will be understood that the invention is by no means limited to such numerical cases, and that the directives can be created in many ways, based on other modifiable characteristics of the test generator engine 12 and the test programs 16.

A metric space is one appropriate choice in which to embed the directives 14, measure similarity, and cluster together events that are associated with similar directives, using known cluster analysis techniques. Once having partitioned the events, a subset of directives is selected from the set of directives in each cluster. Membership in a subset is based on similarities of a member's directives to the directives of other members of the cluster. The terms "similarity" and "similarities" as used herein have their usual well-known meanings in the cluster analysis art.

In a nutshell, cluster analysis is a process of grouping or segmenting a collection of objects into a set of meaningful subsets or subclasses, called clusters, based on their similarity, so that the degree of association is strong between members of the same cluster and weak between members of different clusters. Each cluster thus describes the class to which its members belong. Clustering is essentially an unsupervised learning technique, i.e., the data elements in the training set are not pre-classified. There is no reference solution on which to rely for comparison. Thus, cluster analysis is often used as a tool of discovery. It may reveal associations and structure in data, which, though not previously evident, nevertheless are sensible and useful once found. The results of cluster analysis may contribute to the definition of a formal classification scheme; suggest statistical models with which to describe populations; indicate rules for assigning new cases to classes for identification and diagnostic purposes; provide measures of definition, size and change in what previously were only broad concepts; or find exemplars Many known clustering techniques can be used to group the events and to select representative subsets of directives, based on similarities of their directives in some metric space. Alternatively, a new set of directives intended to cover a cluster of events as a whole may be created.

The approach taken according to the instant invention deviates from classical clustering techniques, in that the grouping of elements in one space is determined by the proximity of related elements in a different space; coverage events are grouped together if their associated stimuli are similar. Thus, the resulting clusters group together events that share a typical context, which in turn can be interpreted as their latent cause. This notion of proximity yields a target oriented clustering. In the context of CDG, the resulting grouping of coverage events is particularly useful in that to all events are capable of being triggered in a single simulation run or test run.

Shifting from targeting of specific events to groups of events contemplates a tradeoff between accuracy and efficiency as defined hereinabove. In the context of coverage, as the CDG procedure iterates, remaining non-covered events tend to become progressively less similar to one another. Thus, a reasonable clustering technique is expected not to group them together. Therefore, they will be stimulated using specifically designed directives. In other words, the tradeoff is effective mainly during early iterations of the CDG process. Later, as fewer non-covered events remain, a smooth transition automatically occurs toward the high-accuracy mode that is associated with specific event-targeted directives.

Figure 2:
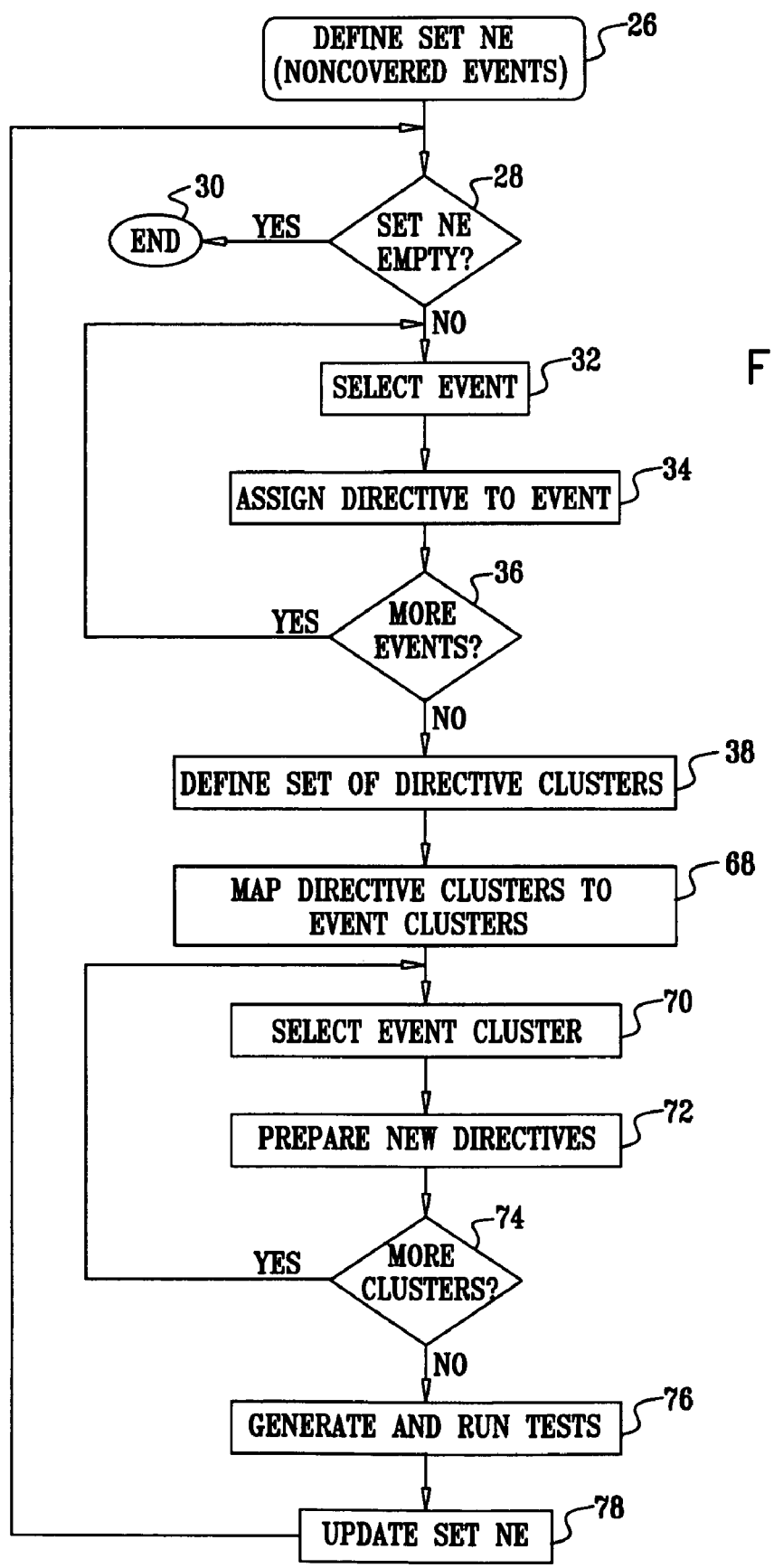
FIG. 2 is a flow chart of a method of coverage-directed test generation for functional verification of a design, according to a disclosed embodiment of the invention.

Reference is now made to FIG. 2, which is a flow chart of a method of coverage-directed test generation for functional verification of a design, according to a disclosed embodiment of the invention. At initial step 26, a coverage space is defined. The events of the coverage space form an initial set of non-covered events NE for the design-under-test.

Control now proceeds to decision step 28, where it is determined if the set NE is an empty set. If the determination at decision step 28 is affirmative, then control proceeds to final step 30, and the procedure ends.

If the determination at decision step 28 is negative, then control proceeds to step 32, which begins a sequence in which the directives are clustered. More particularly, directives that are similar in the sense of a predetermined similarity measure are grouped together. An event of the set NE that was defined in initial step 26 is selected.

Next, at step 34, using the CDG engine, specific directives relating to the event selected in step 32 are assigned in order to be evaluated for inclusion of the event in an event cluster. In each iteration of step 34, a specific directive is designed for an event of the coverage space. Ultimately, a one-to-one mapping between the events of the coverage space and the directives is established. Typically, the directives are designed using a CDG engine.

Control now proceeds to decision step 36, where it is determined if there are more events upon which to perform step 34. If the determination at is affirmative, then control returns to step 32.

If the determination at decision step 36 is negative, then control proceeds to step 38. A set of directives, formed from the combined results of step 34, is now clustered. Application of the well-known K-medoid clustering method is suitable in step 38. However, the invention is not limited to the use of K-medoid clustering, and many known methods of cluster analysis are also suitable, including methods that are more elaborate than K-medoid clustering.

Figure 3:
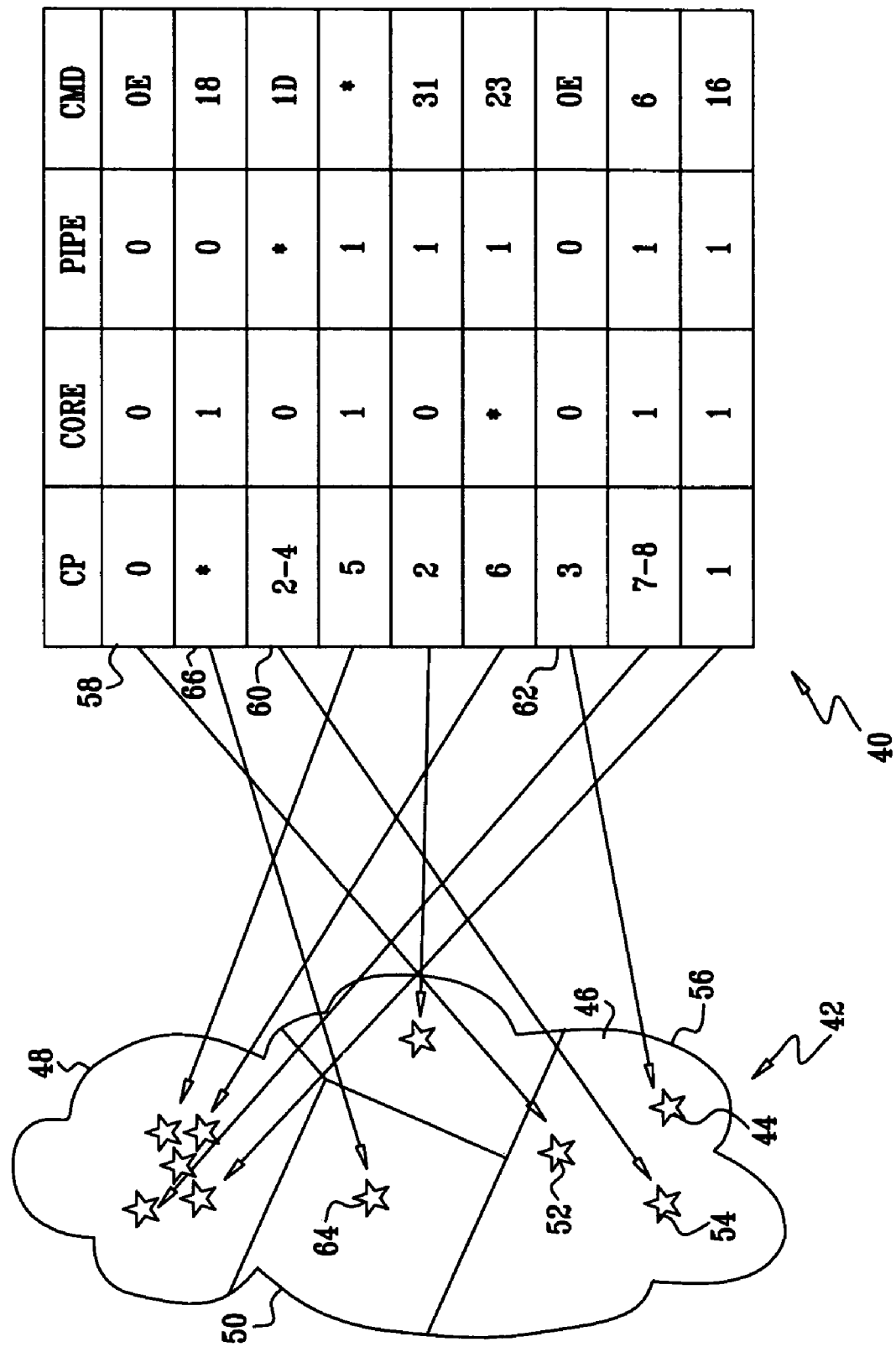
FIG. 3 is a diagram illustrating the clustering of directives in accordance with a disclosed embodiment of the invention.

Reference is now made to FIG. 3, which is a schematic diagram illustrating the clustering of directives just described. A table 40 lists non-covered events of the set NE. In the first iteration of the method, the table 40 includes all events of the coverage space. In subsequent iterations, the table 40 is constructed from coverage analysis, as explained in further detail hereinbelow. The directives that map to the events of the table 40 form a directive space 42, in which individual directives are represented by stars. The directive space 42 is partitioned into a plurality of clusters 44, 46, 48, 50. For example, the cluster 44 contains three directives 52, 54, 56, which correspond respectively to events 58, 60, 62. The cluster 50 contains only one directive 64, corresponding to an event 66.

Referring again to FIG. 2, control proceeds to step 68. The one-to-one mapping between directives and events is exploited, and a set of event clusters C is defined. Due to the one-to-one mapping, every event cluster c in the set of clusters C is a group of events, which matches a set of directives that the clustering algorithm grouped together in step 38.

Next, at step 70, an event cluster of the set C that was defined in step 38 is selected.

Next, at step 72, directives for the current cluster are prepared. In one alternative, step 72 is performed, using the CDG engine, which takes as input all the directives of the current cluster, and creates a single directive that is designed to cover all events in the current cluster.

Alternatively, if the CDG engine is unsuccessful in creating a single directive, it is possible to rely on the fact that clustering algorithms generally produce cluster representatives (cluster "centers") in a cluster partition. These cluster representatives may be used as a set of new directives. The first alternative usually produces a superior result, because in developing the cluster representatives, the cluster algorithm does not take into consideration much of the domain knowledge that is embedded in the CDG engine, such as constraints (syntax) of the directive language. To some extent, this limitation can be overcome by the above-noted k-medoid clustering technique, which selects cluster representatives from available directives, as opposed to calculating them. Calculating optimal cluster representatives is disfavored, as the results may not be syntactically correct.

Control now proceeds to decision step 74, where it is determined if there are more clusters of the set C to be processed. If the determination at decision step 74 is affirmative, then control returns to step 70.

If the determination at decision step 74 is negative, then control proceeds to step 76. Using the directives generated in the iterations of step 72, tests are generated and run, for example, by using the test generator engine 12 and execution engine 18 of the system 10 (FIG. 1). Typically, this is done by simulation.

Next, at step 78, the results of the tests executed in step 76 are evaluated, and the set NE updated. As progress is made, and greater event coverage is achieved, the set NE decreases in size.

Control now returns to decision step 28 where the method is reiterated if non-covered events still remain.

Listing 1 summarizes the method disclosed above with reference to FIG. 2 symbolically.

---
Listing 1

Let NE be the set of non-covered events
while notempty(NE)
    for each ne ∈ NE
        $d_{ne}$ = CDGengine(ne)
    end
    C = Cluster({$d_{ne}$})
    for each c ∈ C
        $d_c$ = CDGengine(c)
    end
    Run simulations using the set of directives {$d_c$}
    Update NE
end

---

EXAMPLE 1

Figure 4:
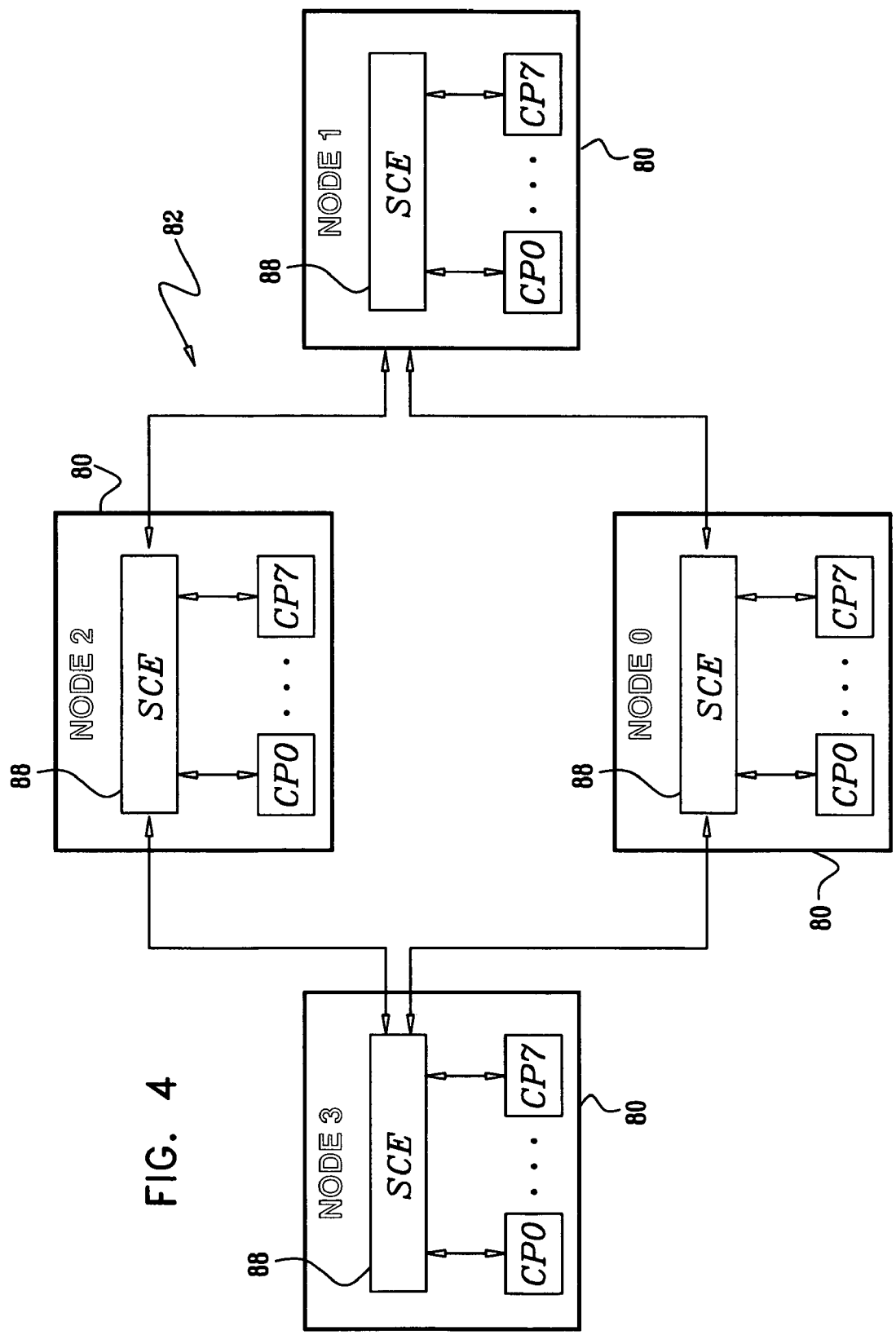
FIG. 4 is a block diagram of the storage control element, which was evaluated in accordance with a disclosed embodiment of the invention.

Reference is now made to FIG. 4, which is a block diagram of the storage control element (SCE) of an IBM z-series™ system, which was evaluated in accordance with a disclosed embodiment of the invention. The experimental environment contains four nodes 80 that are connected in a ring 82.

Figure 5:
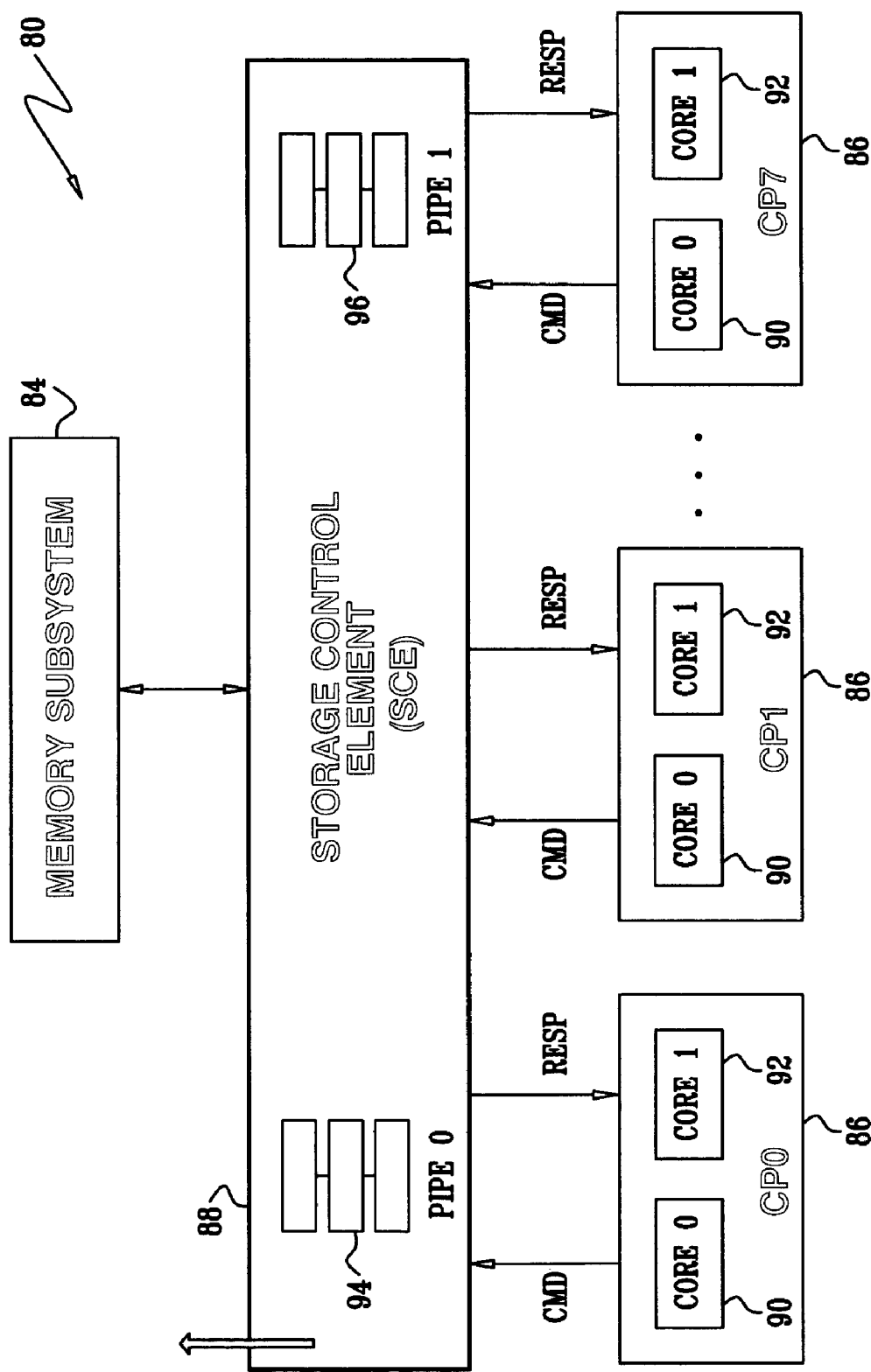
FIG. 5 is a detailed block diagram of a node of the system shown in FIG. 4 in accordance with a disclosed embodiment of the invention.

Reference is now made to FIG. 5, which is a block diagram illustrating one of the nodes 80 (FIG. 4) in further detail. Each of the nodes 80 is comprised of a memory sub-system 84, eight CPU's 86, and a SCE 88 that handles commands from the CPU's 86. Each CPU consists of two cores 90, 92 that independently generate commands to the SCE 88. The SCE 88 handles incoming commands using two internal pipelines 94, 96. When the SCE 88 finishes handling a command, it sends a response to the CPU that generated that command.

The coverage model consists of all the possible transactions between the CPU's 86 and the SCE 88. It contains six attributes: the core that initiated the command, the pipeline in the SCE 88 that handled the command, the command itself, and three attributes that relate to the response.

The example focused on a subspace of the coverage model that deals with unrecoverable errors (UE subspace), containing 98 events. It was attempted to cover the UE subspace using three methods. In the first method, two static sets of directives that attempt to create unrecoverable errors were used. The second method, using a conventional CDG method, generated directives using a CDG engine for each non-covered event in the UE space. Events were not clustered in the second method, but were specifically targeted. In the third method, the algorithm disclosed with reference to FIG. 2 and Listing 1 was used, employing the above-noted K-medoid clustering method. Simulations were run until all the events were covered, or 80 simulation runs had been completed, whichever occurred first.

Figure 6:
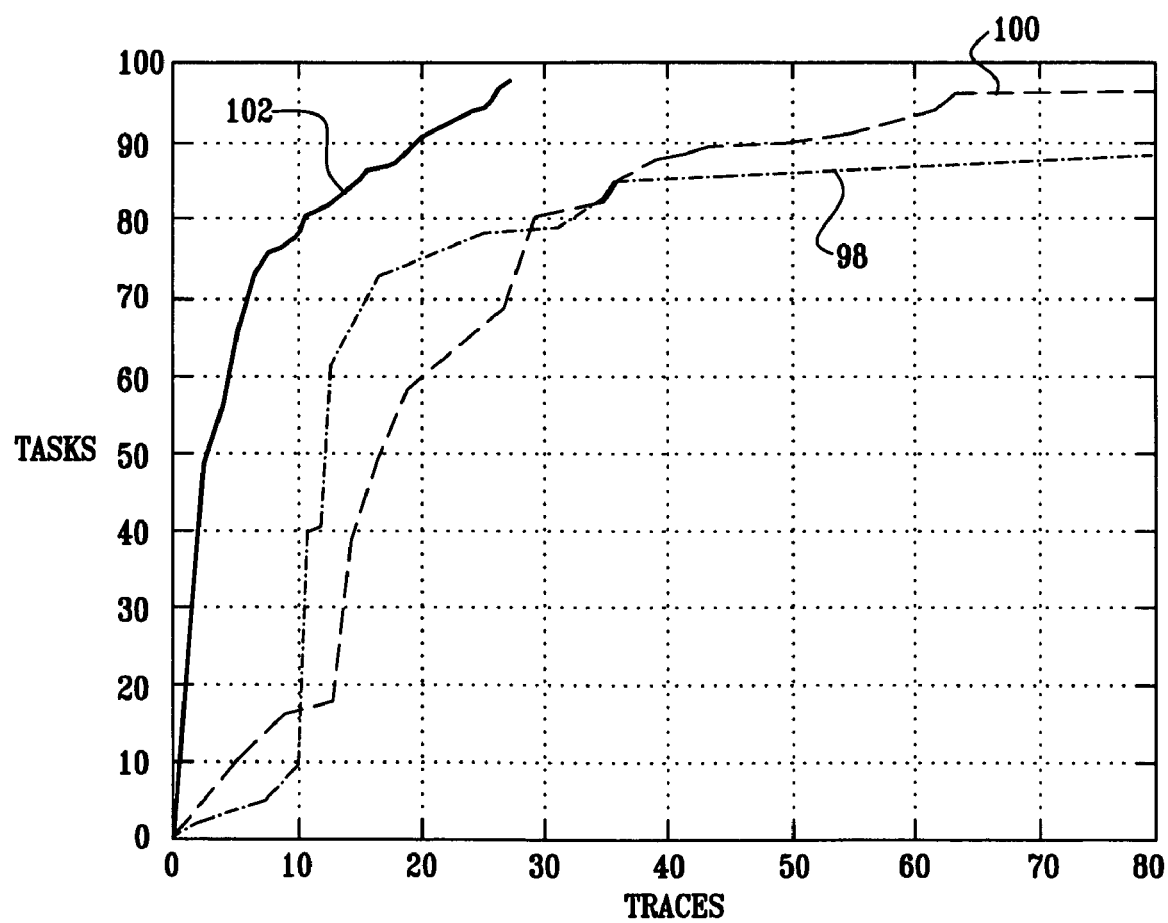
FIG. 6 is a graph comparing the coverage progress for different methods used to evaluate the system shown in FIG. 4 in accordance with a disclosed embodiment of the invention.

Reference is now made to FIG. 6, which is a graph comparing the coverage progress for all three methods used to evaluate the system shown in FIG. 4 and FIG. 5, in accordance with a disclosed embodiment of the invention. The base method, indicated as a broken line 98, managed to cover 89 events after 80 simulation runs, at which point the experiment was halted. The conventional CDG method, indicated by a dashed line 100, succeeded in covering the entire UE subspace after 64 simulation runs. The method according to the invention covered the entire UE subspace after 29 simulation runs, as indicated by a solid line 102.

It will be evident from inspection of FIG. 6, that after 29 simulation runs, the base method had only covered about 79 events, and the conventional CDG method had covered about 72 events.

It will be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art, which would occur to persons skilled in the art upon reading the foregoing description.

The invention claimed is:

1. A method for verifying a design, comprising the steps of:
    executing test programs on said design, said test programs being generated responsively to directives, execution of said test programs causing occurrences of events that are associated with said directives;
    analyzing said occurrences in order to determine a coverage of a coverage space of said design by said test programs;
    defining a set of non-covered events of said coverage space in response to said step of analyzing, wherein said events are selected from a group consisting of a transfer of data, a transfer of a control signal, and an execution of a transaction in said design;
    defining a cluster of said non-covered events by segmenting said non-covered events into subsets, such that a degree of association with respective ones of said directives with which members of said subsets are associated is relatively strong among members of each subset and relatively weak with respect to members of other subsets;
    associating a new directive with said non-covered events in said cluster; and
    generating a new test program responsively to said new directive for re-execution on said design.

2. The method according to claim 1, further comprising the step of iterating said steps of executing, analyzing, defining a set of non-covered events, defining a cluster, associating a new directive, and generating a new test program, using said new test program as one of said test programs until a predetermined end point is attained.

3. The method according to claim 1, wherein said step of executing is performed by simulating said design.

4. The method according to claim 1, wherein said step of executing is performed on a hardware implementation of said design.

5. The method according to claim 1, wherein said steps of steps of executing, analyzing, defining a set of non-covered events, defining a cluster, associating a new directive, and generating a new test program are performed automatically.

6. The method according to claim 1, wherein said step of associating a new directive with said non-covered events in said cluster comprises selecting said new directive from said directives thereof.

7. The method according to claim 1, wherein said step of associating a new directive with said non-covered events in said cluster comprises creating a new set of directives for covering all said events of said cluster.

8. The method according to claim 1, wherein said step of defining a cluster is performed by K-medoid clustering.

9. A computer software product, including a computer-readable medium in which computer program instructions are stored, which instructions, when read by a computer, cause the computer to perform a method for verifying a design, comprising the steps of:
    executing test programs on said design, said test programs being generated responsively to directives, execution of said test programs causing occurrences of events that are associated with said directives, wherein said events are selected from a group consisting of a transfer of data, a transfer of a control signal, and an execution of a transaction in said design;
    analyzing said occurrences in order to determine a coverage of a coverage space of said design by said test programs;
    defining a set of non-covered events of said coverage space in response to said step of analyzing;
    defining a cluster of said non-covered events by segmenting said non-covered events into subsets, such that a degree of association with respective ones of said directives with which members of said subsets are associated is relatively strong among members of each subset and relatively weak with respect to members of other subsets;
    associating a new directive with said non-covered events in said cluster; and
    generating a new test program responsively to said new directive for re-execution on said design.

10. The computer software product according to claim 9, wherein said computer is further instructed to iterate said steps of executing, analyzing, defining a set of non-covered events, defining a cluster, associating a new directive, and generating a new test program, using said new test program as one of said test programs until a predetermined end point is attained.

11. The computer software product according to claim 9, wherein said step of executing is performed by simulating said design.

12. The computer software product according to claim 9, wherein said step of executing is performed on a hardware implementation of said design.

13. The computer software product according to claim 9, wherein said step of associating a new directive with said non-covered events in said cluster comprises selecting said new directive from said directives thereof.

14. The computer software product according to claim 9, wherein said step of associating a new directive with said non-covered events in said cluster comprises creating a new set of directives for covering all said events of said cluster.

15. The computer software product according to claim 9, wherein said step of defining a cluster is performed by K-medoid clustering.

16. A verification system comprising a processor operative to perform a method for verifying a design, comprising the steps of:

executing test programs on said design, said test programs being generated responsively to directives, execution of said test programs causing occurrences of events that are associated with said directives;

analyzing said occurrences in order to determine a coverage of a coverage space of said design by said test programs;

defining a set of non-covered events of said coverage space in response to said step of analyzing, wherein said events are selected from a group consisting of a transfer of data, a transfer of a control signal, and an execution of a transaction in said design;

defining a cluster of said non-covered events by segmenting said non-covered events into subsets, such that a degree of association with respective ones of said directives with which members of said subsets are associated is relatively strong among members of each subset and relatively weak with respect to members of other subsets;

associating a new directive with said non-covered events in said cluster; and generating a new test program responsively to said new directive for re-execution on said design.

17. The verification system according to claim 16, wherein said processor is operative to iterate said steps of executing, analyzing, defining a set of non-covered events, defining a cluster, associating a new directive, and generating a new test program, using said new test program as one of said test programs until a predetermined end point is attained.

18. The verification system according to claim 16, wherein said step of executing is performed by simulating said design.

19. The verification system according to claim 16, wherein said step of executing is performed on a hardware implementation of said design.

20. The verification system according to claim 16, wherein said steps of steps of executing, analyzing, defining a set of non-covered events, defining a cluster, associating a new directive, and generating a new test program are performed automatically.

21. The verification system according to claim 16, wherein said step of associating a new directive with said non-covered events in said cluster comprises selecting said new directive from said directives thereof.

22. The verification system according to claim 16, wherein said step of associating a new directive with said non-covered events in said cluster comprises creating a new set of directives for covering all said events of said cluster.

23. The verification system according to claim 16, wherein said step of defining a cluster is performed by K-medoid clustering.

* * * * *